United States Patent
Li et al.

(10) Patent No.: US 10,255,833 B2
(45) Date of Patent: Apr. 9, 2019

(54) LIGHT-ON MODULE TESTING DEVICE, METHOD FOR TESTING LIGHT-ON MODULE AND METHOD FOR TESTING DISPLAY PANEL

(71) Applicants: BOE TECHNOLOGY GROUP CO., LTD., Beijing (CN); BEIJING BOE DISPLAY TECHNOLOGY CO., LTD., Beijing (CN)

(72) Inventors: Wei Li, Beijing (CN); Yo Seop Cheong, Beijing (CN); Namin Kwon, Beijing (CN); Minghui Ma, Beijing (CN); Jinhu Cao, Beijing (CN); Xin Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 246 days.

(21) Appl. No.: 15/136,085

(22) Filed: Apr. 22, 2016

(65) Prior Publication Data

US 2017/0074940 A1 Mar. 16, 2017

(30) Foreign Application Priority Data

Sep. 11, 2015 (CN) .......................... 2015 1 0580536

(51) Int. Cl.
*G01R 31/317* (2006.01)
*G09G 3/00* (2006.01)
*G01R 1/04* (2006.01)

(52) U.S. Cl.
CPC ........... *G09G 3/006* (2013.01); *G01R 1/0408* (2013.01)

(58) Field of Classification Search
CPC .. G01R 31/2635; G09G 3/006; G09G 3/3233; G09G 2330/12
See application file for complete search history.

(56) References Cited

U.S. PATENT DOCUMENTS

| | | | |
|---|---|---|---|
| 2002/0039030 A1* | 4/2002 | Khazei | G01R 29/0871 324/754.29 |
| 2004/0064285 A1* | 4/2004 | Repko | G01R 31/2808 702/120 |
| 2004/0263544 A1* | 12/2004 | Kojima | B41J 2/165 347/5 |

FOREIGN PATENT DOCUMENTS

| | | |
|---|---|---|
| CN | 103837758 A | 6/2014 |
| CN | 104515914 A | 4/2015 |
| CN | 104714056 A | 6/2015 |
| JP | 4701657 B2 | 6/2011 |

OTHER PUBLICATIONS

The First Office Action dated Aug. 2, 2017, Appln. 201510580536.X.

* cited by examiner

*Primary Examiner* — Tung X Nguyen
(74) *Attorney, Agent, or Firm* — Ladas & Parry LLP

(57) ABSTRACT

A light-on module testing device, a method for testing a light-on module and a method for testing a display panel are disclosed. The light-on module testing device includes a base, a support element disposed on the base, and a test platform disposed on the base, wherein an arm is disposed on the support element, and the arm is configured to fix a light-on module to be tested, and a tester is disposed on the test platform and the tester has a signal output end.

19 Claims, 10 Drawing Sheets

LIGHT-ON MODULE TESTING DEVICE, METHOD FOR TESTING LIGHT-ON MODULE AND METHOD FOR TESTING DISPLAY PANEL

TECHNICAL FIELD

Embodiments of the present disclosure relate to a light-on module testing device, a method for testing a light-on module and a method for testing a display panel.

BACKGROUND

Light-on device (probe unit) is an apparatus used in display device field such as liquid crystal display, plasma display panel, organic light-emitting diode display to load signals for a display panel and to detect defects of a display panel.

SUMMARY

At least one embodiment of the disclosure provides a light-on module testing device, a method for testing a light-on module and a method for testing a display panel.

At least one embodiment of the disclosure provides a light-on module testing device comprising: a base; a support element disposed on the base, wherein an arm is disposed on the support element, and the arm is configured to fix a light-on module to be tested; and a test platform disposed on the base, wherein a tester is disposed on the test platform and the tester has a signal output end.

For example, according to the light-on module testing device provided by one embodiment of the present disclosure, the tester comprises at least one test electrode, the light-on module to be tested comprises at least one probe, the at least one test electrode corresponds to the at least one probe, and the at least one test electrode is connected with the signal output end.

For example, according to the light-on module testing device provided by one embodiment of the present disclosure, the tester has a same electrode structure with that of a pad area of a display panel corresponding to the light-on module to be tested.

For example, according to the light-on module testing device provided by one embodiment of the present disclosure, the test platform comprises an upper member and a lower member, the lower member is disposed on the base, the upper member is disposed on the lower member, the upper member is detachable, and the tester is disposed on the upper member.

For example, according to the light-on module testing device provided by one embodiment of the present disclosure, a first propulsion mechanism is disposed on the test platform, the first propulsion mechanism is configured to drive the upper member to move along a first direction with respect to the lower member.

For example, according to the light-on module testing device provided by one embodiment of the present disclosure, the first propulsion mechanism comprises an X axis rotating rod, a screw thread disposed on the X axis rotating rod, and a screw thread hole disposed on the upper member, the X axis rotating rod is disposed on a side plate of the lower member, the screw thread disposed on the X axis rotating rod is engaged with the screw thread hole disposed on the upper member, the upper member is driven to move along an X axis direction by rotating the X axis rotating rod, and the X axis direction is the first direction.

For example, according to the light-on module testing device provided by one embodiment of the present disclosure, a first groove and a first protrusion which are matched each other are disposed on the upper member and the lower member, respectively, the first groove and the first protrusion are disposed along the first direction.

For example, according to the light-on module testing device provided by one embodiment of the present disclosure, a second propulsion mechanism is disposed on the test platform, the second propulsion mechanism is configured to drive the test platform to move along a second direction with respect to the base, the second direction is perpendicular to the first direction.

For example, according to the light-on module testing device provided by one embodiment of the present disclosure, the second propulsion mechanism comprises a Y axis rotating rod, a gear disposed on the Y axis rotating rod, and a teeth bar disposed on the base, the Y axis rotating rod is mounted on a bottom of the test platform, the gear disposed on the Y axis rotating rod is engaged with the teeth bar disposed on the base, the test platform is driven to move along a Y axis direction by rotating the Y axis rotating rod, and the Y axis direction is the second direction.

For example, according to the light-on module testing device provided by one embodiment of the present disclosure, a second groove and a second protrusion which are matched each other are disposed on the base and the bottom of the test platform, respectively, and the second groove and the second protrusion are disposed along the second direction.

For example, according to the light-on module testing device provided by one embodiment of the present disclosure, a receiving slot is disposed on the bottom of the test platform, and the Y axis rotating rod is disposed in the receiving slot.

For example, according to the light-on module testing device provided by one embodiment of the present disclosure, the support element comprises a fixed support, a movable support, and a third propulsion mechanism, the arm is disposed on the movable support, the third propulsion mechanism is configured to drive the movable support to move along a third direction with respect to the fixed support, and the third direction is perpendicular to the first direction and the second direction.

For example, according to the light-on module testing device provided by one embodiment of the present disclosure, the third propulsion mechanism comprises a Z axis rotating rod, a gear disposed on the Z axis rotating rod, and a teeth bar disposed on the movable support, the Z axis rotating rod is mounted on the fixed support, the gear disposed on the Z axis rotating rod is engaged with the teeth bar disposed on the movable support, the movable support is driven to move along a Z axis direction by rotating the Z axis rotating rod so that the light-on module to be tested is driven along the Z axis direction, and the Z axis direction is the third direction.

For example, according to the light-on module testing device provided by one embodiment of the present disclosure, a third groove and a third protrusion which are matched each other are disposed on the fixed support and the movable support, respectively, the third groove and the third protrusion are disposed along the third direction.

For example, according to the light-on module testing device provided by one embodiment of the present disclosure, the arm is pivotally connected with the movable support.

For example, according to the light-on module testing device provided by one embodiment of the present disclosure, a spring is disposed between the arm and the movable support.

For example, according to the light-on module testing device provided by one embodiment of the present disclosure, a via hole is disposed in the arm, a connection hole is disposed on the light-on module to be tested, a screw fastener is disposed in the via hole to fix the light-on module to be tested.

For example, according to the light-on module testing device provided by one embodiment of the present disclosure, a signal interface throughout the arm is disposed in the arm, an end of the signal interface is connected with a flexible printed circuit which is connected with the light-on module to be tested, and the other end of the signal interface is a signal input end.

For example, according to the light-on module testing device provided by one embodiment of the present disclosure, further comprising a conversion circuit connected with the signal output end and a computer connected with the conversion circuit.

At least one embodiment of the disclosure provides a method for testing a light-on module by using a light-on module testing device, wherein the light-on module testing device comprises a base, a support element disposed on the base, and a test platform disposed on the base, an arm is disposed on the support element, and the arm is configured to fix a light-on module to be tested, a tester is disposed on the test platform and the tester has a signal output end; and the method comprises following steps: contacting the light-on module to be tested with the tester; inputting an electrical signal to the light-on module to be tested, and outputting an output signal by the signal output end of the tester; and analyzing the output signal.

For example, according to the method for testing a light-on module by using a light-on module testing device provided by one embodiment of the present disclosure, the tester comprises at least one test electrode, the light-on module to be tested comprises at least one probe, the at least one test electrode corresponds to the at least one probe, and the step of contacting the light-on module to be tested with the tester comprises: contacting the at least one probe of the light-on module to be tested with the at least one test electrode of the tester correspondingly.

For example, according to the method for testing a light-on module by using a light-on module testing device provided by one embodiment of the present disclosure, the tester has a same electrode structure with that of a pad area of a display panel corresponding to the light-on module to be tested, and the pad area of the display panel comprises at least one electrode.

For example, according to the method for testing a light-on module by using a light-on module testing device provided by one embodiment of the present disclosure, the at least one test electrode is connected with the signal output end to transmit the electrical signal from the at least one probe to the signal output end through the at least one test electrode.

At least one embodiment of the disclosure provides a method for testing a display panel comprising: testing a light-on module by the method according to any one of the method for testing a light-on module by using a light-on module testing device provided by embodiments of the present disclosure, and testing a display panel by the light-on module.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

REFERENCE NUMERALS

100—base;
110—support element;
111—arm;
112—light-on module to be tested;
1121—probe;
1122—probe structure;
113—fixed support;
114—movable support;
115—third propulsion mechanism;
1151—Z axis rotating rod;
1152—gear;
1153—teeth bar;
1161—third protrusion;
1162—third groove;
117—spring;
1181—via hole;
1182—connection hole;
119—screw fastener;
1120—signal interface;

120—testing platform;
121—upper member;
122—lower member;
1221—side plate of a lower member;
123—first propulsion mechanism;
1231—X axis rotating rod;
1232—screw thread hole;
1233—screw thread;
1241—first protrusion;
1242—first groove;
125—second propulsion mechanism;
1251—Y axis rotating rod;
1252—gear;
1253—teeth bar;
1261—second protrusion;
1262—second groove;
127—receiving slot;
130—tester;
131—signal output end;
132—electrode structure;
1321—test electrode;
13211—joint;
140—computer;
150—conversion circuit.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
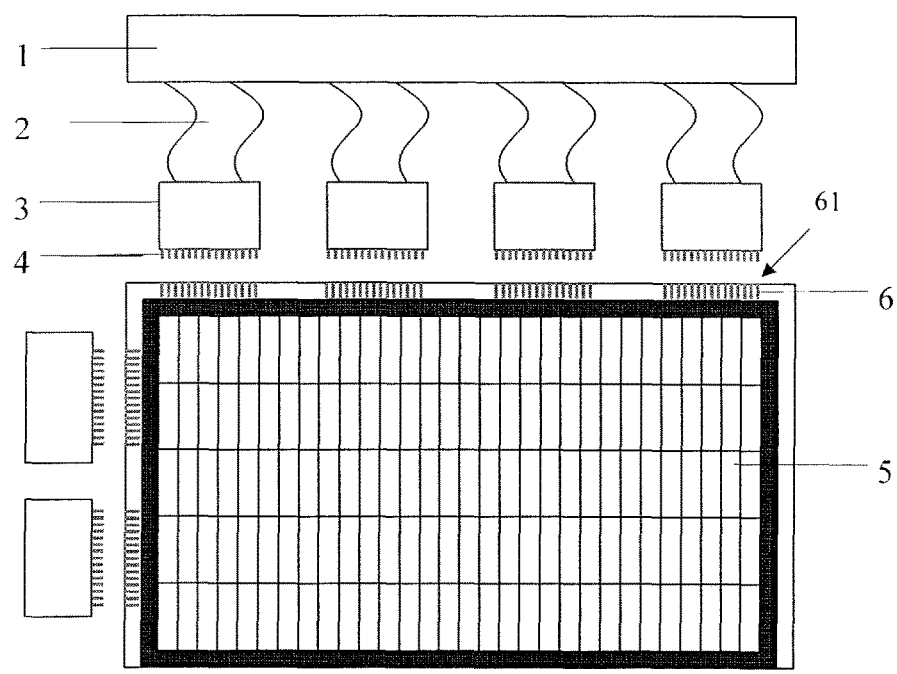
FIG. 1 is a schematic view of a light-on unit testing a display panel.

As illustrated in FIG. 1, a control signal generated by a printed circuit board (PCB) 1 is transmitted to a light-on module (probe block) 3 by a flexible printed circuit (FPC) 2 and then is loaded to a display panel by probes 4 of a light-on module 3. A position of a defect of a display panel can be tested by observing a state of the display panel 5. The control signal includes at least one of a start signal, a clock pulse signal, a data signal, an output enable signal, etc. The probes 4 correspond to electrodes/connectors/wires of a pad area of a display panel in a one-to-one relationship. A probe structure of a light-on module corresponds to the electrode/connector/wire structure of a display panel.

Because a probe size and a distance between two adjacent probes of a light-on module is small (dozens of micrometers), the amount of probes is large, the probes are easy to be destroyed, defects such as bending deformation of probes, fracture, and shortcut generated by contact of different probes may easily occur. In the case that a probe is broken, a light-on display picture may be abnormal, and a test error may be generated. However, the position of a broken probe may not be tested rapidly and accurately only by naked eye observation (observe directly or by a microscope). Furthermore, no specific apparatus can test a light-on module after being maintained to guarantee the quality of a maintenance product. Usually, a light-on module needs to be tested on a production apparatus, and only according to the light-on phenomenon to infer reasons why the light-on module is abnormal, the accurate positions of abnormal probes cannot be determined, and the production apparatus is occupied, the test efficiency and apparatus activation are reduced. Moreover, when no corresponding display panel is in production and the yield needs to be large, extra maintenance time is difficult to be obtained, test may get difficult.

At least one embodiment of the present disclosure provides a light-on module testing device comprising a base, a support element disposed on the base, and a test platform disposed on the base, wherein an arm is disposed on the support element, and the arm is configured to fix a light-on module to be tested, and a tester is disposed on the test platform and the tester has a signal output end.

The light-on module testing device is an independent apparatus, in one aspect, a position of an abnormal probe can be determined rapidly and accurately, the test efficiency is improved. In another aspect, the light-on module testing device with respect to test by a production apparatus, activation (production efficiency) can be improved. The light-on module testing device can be used for testing the light-on module.

Several embodiments of the present disclosure are illustrated in the following.

Embodiment 1

Figure 2A:
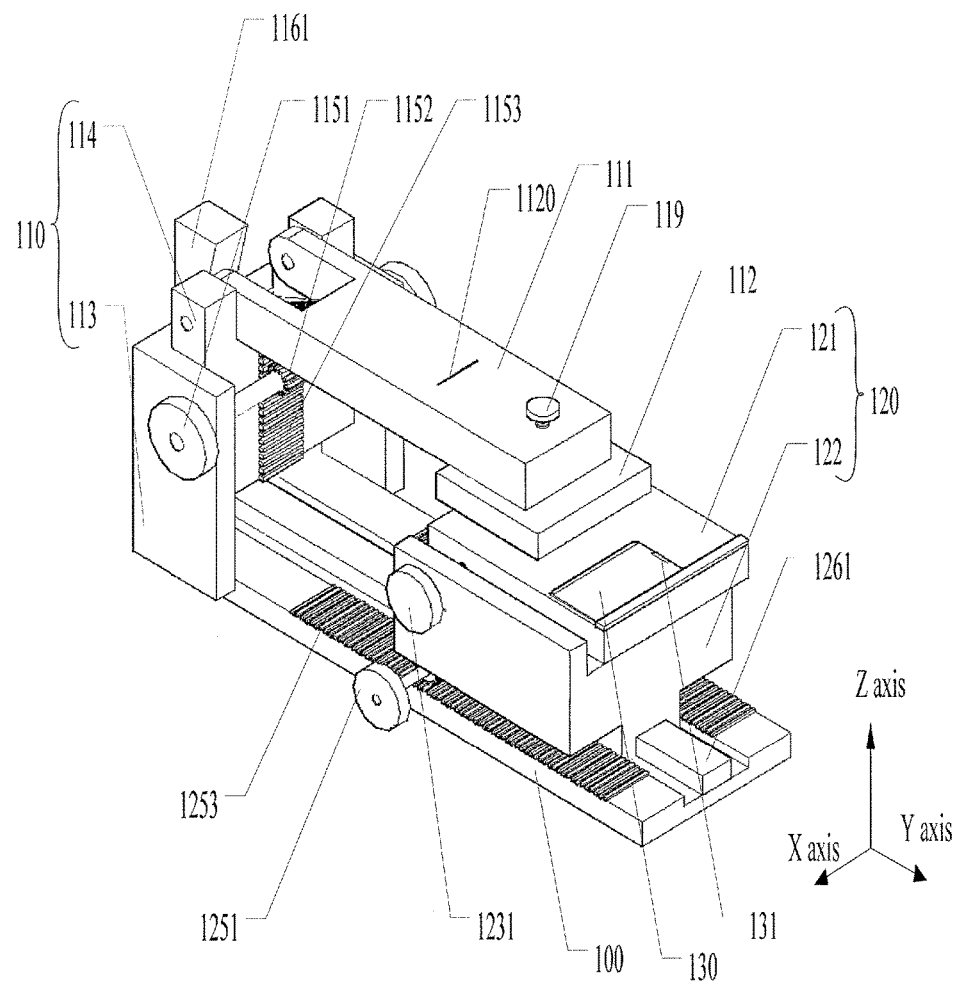
FIG. 2a is a perspective schematic view of a light-on module testing device provided by an embodiment of the disclosure (arm is dropped)
Figure 2B:
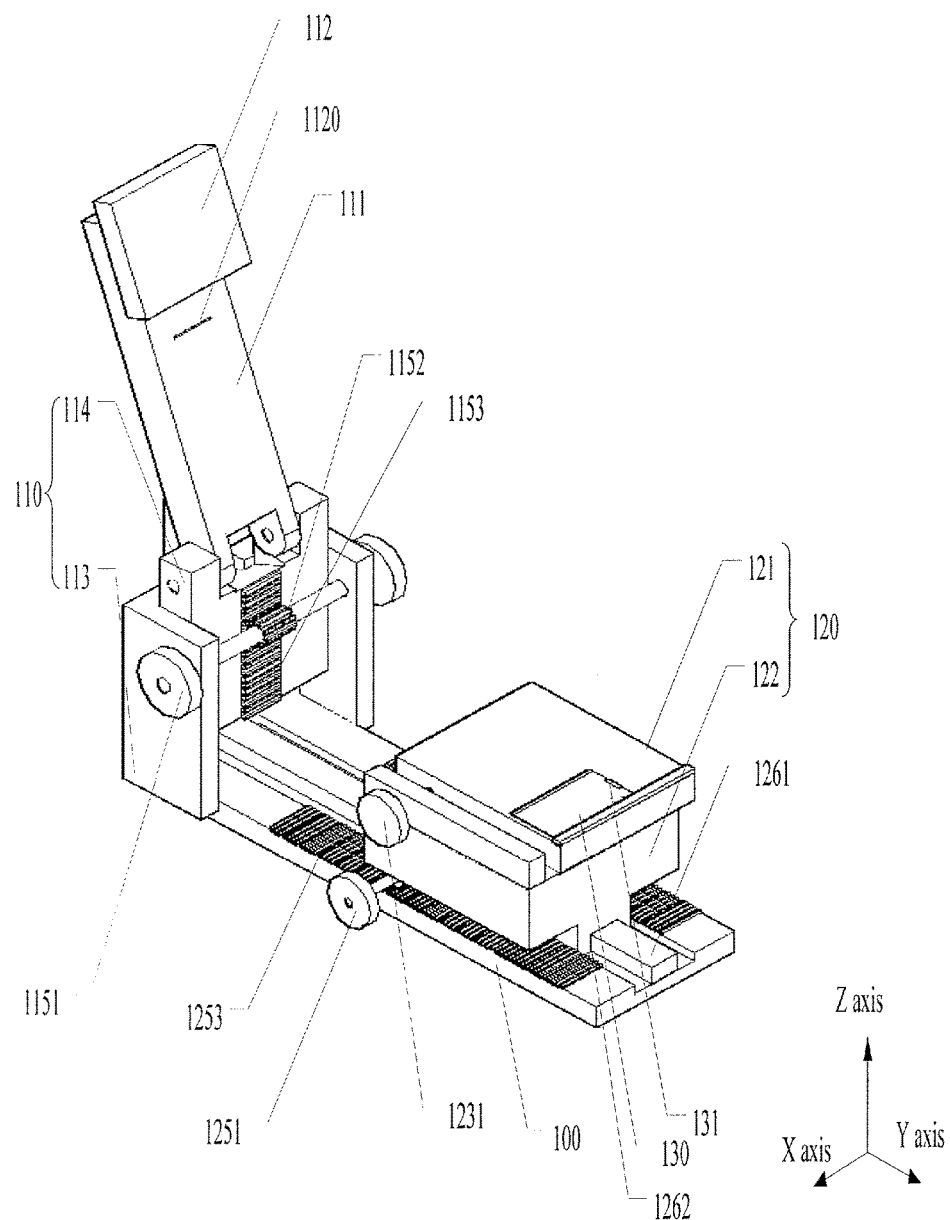
FIG. 2b is a perspective schematic view of a light-on module testing device provided by an embodiment of the disclosure (arm is raised)

A light-on module testing device is provided by the embodiment. As illustrated in FIG. 2a and FIG. 2b, the light-on module testing device comprises a base 100, a support element 110 disposed on the base 100, and a test platform 120 disposed on the base 100. An arm 111 is disposed on the support element 110, and the arm 111 is configured to fix a light-on module to be tested 112. A tester 130 is disposed on the test platform 120 and the tester 130 has a signal output end 131.

Figure 3:
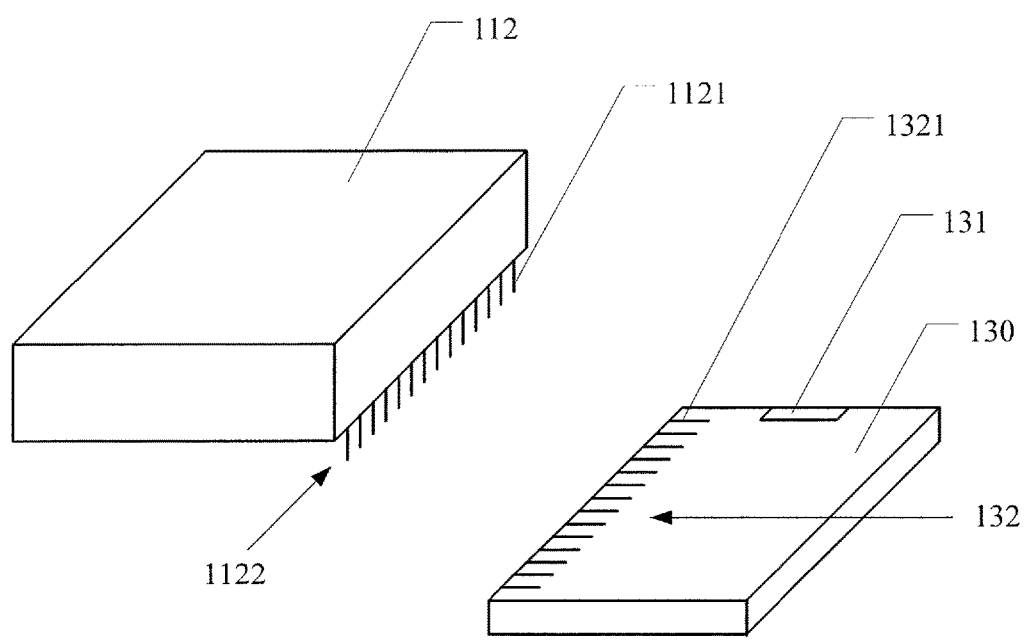
FIG. 3 is a schematic view of an electrode structure and a probe structure of a light-on module testing device provided by an embodiment of the disclosure.

For example, as illustrated in FIG. 3, the tester 130 comprises at least one test electrode 1321 (electrode structure 132 comprises at least one test electrode 1321), the light-on module to be tested 112 comprises at least one probe 1121 (probe structure 1122 comprises at least one probe 1121), the at least one test electrode 1321 corresponds to the at least one probe 1121 respectively, the at least one test electrode 1321 is connected with the signal output end 131. For example, all test electrodes need to be connected with the signal output end 131. That is, test electrodes disposed are all connected with the signal output end. For example, the at least one test electrode 1321 and the at least one probe 1121 can correspond in a one-to-one relationship. It is to be noted that, at least one includes one and more than one. More than one for example means greater than one. FIG. 3 takes a plurality of test electrodes 1321 and a plurality of probes 1121 as an example to illustrate. The electrode structure of the tester 130 can also be one test electrode 1321, and the probe structure 1122 of the light-on module to be tested 112 can also be one probe 1121. The signal output end 131 can also be in other positions. For example, the signal output end 131 is disposed on left side of the test electrodes 1321 or underside of the tester 130. However, embodiments of the present disclosure are not limited thereto. The shape of the test electrode is not limited to line-shaped as illustrated in FIG. 3. For example, a structure that becomes narrow from test electrodes to the signal output end can be adopted, and a structure that is fanout and a structure connected in lines, not narrow and not fanout can also be adopted. The embodiments of the disclosure are not limited thereto.

For example, according to the light-on module testing device provided by one example of the embodiment, the tester 130 has the same electrode structure with that of a pad area of a display panel corresponding to the light-on module to be tested 112. A display panel corresponding to the light-on module to be tested 112 means that the light-on module to be tested is suitable for the display panel during the light-on testing process. Because the electrode structure 61 of the tester is the same as that of the pad area of the display panel (referring to FIG. 1), the probe structure of the light-on module matches with the electrode structure of the tester. For example, the electrode structure 61 of the pad area of the display panel includes at least one electrode 6. Therefore, the tester 130 of the light-on module testing device provided by the embodiment can be designed to have different electrode structures 132 according to different light-on modules to be tested 112 to match with the light-on modules to be tested 112, so as to realize rapid test to different light-on modules to be tested 112.

For example, a material of the test electrode of the tester can be a conductive material. For example, metal can be used. For example, the test electrode can be prepared by a material the same as that of a gate line, a data line, a gate electrode, or a source/drain electrode. For example, the material of the test electrode of the tester can be any one of a single layer of aluminum, aluminum alloy, copper, copper alloy, molybdenum, or laminated layers of some kinds of above-mentioned materials. The embodiments of the present disclosure are not limited thereto. For example, a method of forming the test electrode can refer to that of forming the gate line, the data line, the gate electrode, or the source/drain electrode, limitations are not imposed thereto.

Because the accuracy of the electrode structure of the tester is high, for example, it can be formed by a patterning process, limitations are not imposed thereto.

It should be understood that, in embodiments of the disclosure, a patterning process can include a photolithography process, or include a photolithography process and an etching process, or can include other processes such as a printing process or an ink-jet process to form a predetermined pattern. The photolithography process includes processes such as a film forming process, an exposure process, and a developing process etc., and a pattern can be formed by photoresist, a mask, and an exposure apparatus. The patterning process can be chosen according to the structure formed in embodiments of the present disclosure.

For example, according to the light-on module testing device provided by one example of the embodiment, as illustrated in FIG. 2a and FIG. 2b, the test platform 120 comprises an upper member 121 and a lower member 122. The lower member 122 is disposed on the base 100. The upper member 121 is detachably disposed on the lower member 122. The tester 130 is disposed on the upper member 121. Of course, the tester 130 can also be detachable, replaceable. The tester 130 can be replaced to a corresponding tester 130 according to different types of light-on module to be tested 112.

Figure 4:
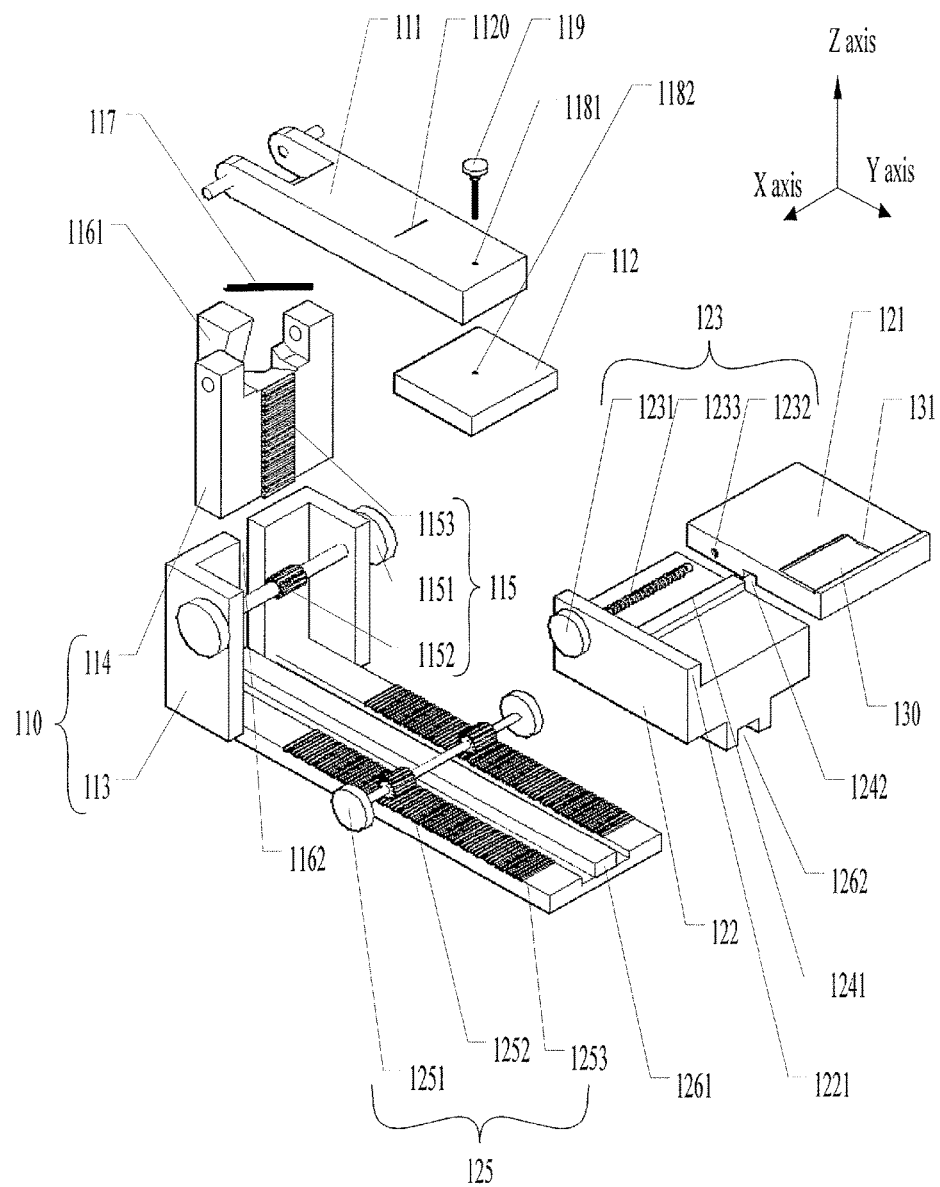
FIG. 4 is an exploded schematic view of a light-on module testing device provided by an embodiment of the disclosure.

For example, according to the light-on module testing device provided by one example of the embodiment, as illustrated in FIG. 4, a first propulsion mechanism 123 is disposed on the test platform 120, the first propulsion mechanism 123 is configured to drive the upper member 121 to move along a first direction with respect to the lower member 122.

For example, as illustrated in FIG. 4, in one example, a first propulsion mechanism 123 is disposed on the test platform 120. The first propulsion mechanism 123 comprises an X axis rotating rod 1231 disposed on the lower member 122, a screw thread 1233 disposed on the X axis rotating rod 1231, and a screw thread hole 1232 disposed on the upper member 121 at a position corresponding to the X axis rotating rod 1231. The X axis rotating rod 1231 is disposed on a side plate 1121 of the lower member 122. The screw thread 1233 disposed on the X axis rotating rod 1231 is engaged with the screw thread hole 1232 disposed on the upper member 121. The upper member 121 is driven to move along an X axis direction by rotating the X axis rotating rod 1231, the X axis direction is the first direction.

It is to be noted that, the first propulsion mechanism 123 can also adopt other propulsion mechanisms. Limitations are not imposed to the thread propulsion mechanism provided by the example of the embodiment.

For example, according to the first propulsion mechanism provided by one example of the embodiment, subtle movement of the upper member 121 can be realized by setting related parameters such as parameters of a knob outside the X axis rotating rod and parameters of the X axis rotating rod, and then, the position of the tester 130 disposed on the upper member 121 can be adjusted well to match with the light-on module to be tested 112. For example, the related parameters can include the ratio of the parameter of the knob outside the X axis rotating rod to that of the X axis rotating rod, major diameter, and/or minor diameter, and/or pitch of the screw thread disposed on the X axis rotating rod and/or the screw thread hole.

For example, according to the light-on module testing device provided by one example of the embodiment, as illustrated in FIG. 4, a first groove 1242 and a first protrusion 1241 which are matched each other are disposed on the upper member 121 and the lower member 122 respectively, and the first groove 1242 and the first protrusion 1241 are disposed along the first direction. For example, the first groove 1242 can be disposed on the upper member 121, and the first protrusion 1241 can be disposed on the lower member 122. Alternatively, the first groove 1242 can be disposed on the lower member 122, and the first protrusion 1241 can be disposed on the upper member 121, limitations are not imposed thereto. It is to be noted that, the movement of the upper member 121 with respect to the lower member 122 can be more stable by disposing the first groove 1242 and the first protrusion 1241, and the accuracy of movement along the first direction can be increased.

For example, according to the light-on module testing device provided by one example of the embodiment, as illustrated in FIG. 4, a second propulsion unit 125 is disposed on the test platform 120. The second propulsion unit 125 is configured to drive the test platform 120 to move along a second direction with respect to the base 100, and the second direction is perpendicular to the first direction.

For example, in one example, as illustrated in FIG. 4, the second propulsion unit 125 comprises a Y axis rotating rod 1251 mounted on a bottom of the test platform 120, a gear 1252 disposed on the Y axis rotating rod 1251, and a teeth bar 1253 disposed on the base 100. The gear disposed on the Y axis rotating rod 1251 is engaged with the teeth bar disposed on the base 100. The gear 1252 disposed on the Y axis rotating rod 1251 rolls on the teeth bar 1253 disposed on the base 100 by rotating the Y axis rotating rod 1251, so as to drive the test platform 120 to move along a Y axis direction, and the Y axis direction is the second direction.

It is to be noted that, the second propulsion mechanism 125 can also adopt other propulsion mechanisms. Limitations are not imposed to the gear propulsion mechanism provided by the example of the embodiment.

For example, according to the second propulsion mechanism provided by one example of the embodiment, subtle movement of the test platform 120 can be realized by setting related parameters such as parameters of a knob outside the Y axis rotating rod 1231 and parameters of the Y axis rotating rod, so that the position of the tester 130 disposed on the test platform 120 can be adjusted well to match with the light-on module to be tested 112. For example, the related parameters can include a ratio of the radius of the knob outside the Y axis rotating rod to that of the Y axis rotating rod, teeth number and/or module of the gear disposed on the Y axis rotating rod and/or the teeth bar disposed on the base etc.

For example, according to the light-on module testing device provided by one example of the embodiment, as illustrated in FIG. 4, a second protrusion 1261 and a second groove 1262 which are matched each other are disposed on the base 100 and the bottom of the test platform 120 respectively. For example, the second protrusion 1261 can be disposed on the base 100, and the second groove 1262 can be disposed on the bottom of the test platform 120. Alternatively, the second groove 1262 can also be disposed on the base 100, and the second protrusion 1261 can be disposed on the bottom of the test platform 120. Limitations are not imposed thereto. The second groove 1262 and the second protrusion 1261 matched with each other are disposed along the second direction. It is to be noted that, the movement of test platform 120 with respect to the base 100 can be more stable by disposing the second protrusion 1261 and the second groove 1262, and the accuracy of movement along the second direction can be increased.

Figure 5:
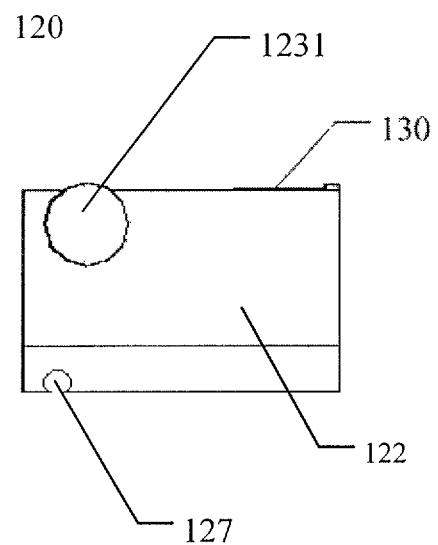
FIG. 5 is a schematic view of a receiving slot of a light-on module testing device provided by an embodiment of the disclosure.

For example, according to the light-on module testing device provided by one example of the embodiment, as illustrated in FIG. 5, a receiving slot 127 is disposed on the bottom of the test platform 120, and the Y axis rotating rod 1251 is disposed in the receiving slot 127. Therefore, the test platform can be driven to move along the Y axis direction by rotating the Y axis rotating rod.

For example, according to the light-on module testing device provided by one example of the embodiment, as illustrated in FIG. 4, the support element 110 comprises a fixed support 113 fixed on the base 100, a movable support 114, and a third propulsion mechanism 115. The arm 111 is disposed on the movable support 114. The third propulsion mechanism 115 is configured to drive the movable support 114 to move along a third direction with respect to the fixed support 113, and the third direction is perpendicular to the first direction and the second direction.

For example, in one example, as illustrated in FIG. 4, the third propulsion mechanism 115 comprises a Z axis rotating rod 1151 mounted on the fixed support 113, a gear 1152 disposed on the Z axis rotating rod 1151, and a teeth bar 1153 disposed on the movable support 114. The gear 1152 disposed on the Z axis rotating rod 1151 is engaged with the teeth bar 1153 disposed on the movable support 114. The third propulsion mechanism 115 is configured to drive the movable support 114 to move along the third direction with respect to the fixed support 114. For example, the gear 1152 disposed on the Z axis rotating rod 1151 is driven to rotate by rotating the Z axis rotating rod 1151, the movable support 114 is driven to move along the Z axis direction by the movement of the teeth bar 1153 disposed on the movable support 114 by being engaged with the gear 1152, and then the arm 111 is driven to move along the Z axis direction to drive the light-on module to be tested 112 move along the Z axis direction. The Z axis direction is the third direction.

It is to be noted that, the third propulsion mechanism 115 can also adopt other propulsion mechanisms. Limitations are not imposed to the gear propulsion mechanism provided by the example of the embodiment.

For example, according to the third propulsion mechanism provided by one example of the embodiment, subtle movement of the 111 can be realized by setting related parameters such as parameters of a knob outside the Z axis rotating rod and parameters of the Y axis rotating rod, so that the position of the light-on module to be tested 112 on the arm 111 can be adjusted well to match with the tester 130. For example, the related parameters can include a ratio of the radius of the knob outside the Z axis rotating rod to that of the Z axis rotating rod, teeth number and/or module of the gear disposed on the Z axis rotating rod and/or the teeth bar disposed on the movable support etc.

For example, according to the light-on module testing device provided by one example of the embodiment, as illustrated in FIG. 4, movement in three dimensional (along the first direction, the second direction, and the third direction) of the tester 130 with respect to the light-on module to be tested 112 can be realized by the first propulsion mechanism 123, the second propulsion mechanism 125 and the third propulsion mechanism 115, and the position of the tester 130 with respect to the light-on module to be tested 112 can be adjusted accurately, and a position of an abnormal probe can be tested accurately. It is to be noted that, other propulsion mechanisms can be used to realize the movement of the tester 130 with respect to the light-on module to be tested 112 of the embodiment.

For example, according to the light-on module testing device provided by one example of the embodiment, as illustrated in FIG. 4, a third groove 1162 and a third protrusion 1161 which are matched each other are disposed on the fixed support 113 and the movable support 114 respectively, the third groove 1162 and the third protrusion 1161 match each other and are disposed along the third direction. It is to be noted that, movement of the movable support 114 with respect to the fixed support 113 can be more stable by disposing the third protrusion 1161 and the third groove 1162, and the accuracy of movement along the third direction can be increased.

For example, according to the light-on module testing device provided by one example of the embodiment, the arm 111 is pivotally connected with the support element 110. For example, as illustrated in FIG. 4, the arm 111 is pivotally connected with the movable support 114. For example, the arm 111 and the movable support 114 can be connected by shaft-hole fit. For example, a shaft and a hole can be disposed on the arm 111 and the support element 110 respectively. It is to be noted that, the shaft or the hole is disposed on the arm 111 or on the support element 110 in the embodiment, which is not limited.

For example, according to the light-on module testing device provided by one example of the embodiment, a spring 117 is disposed between the arm 111 and the support element 110. For example, as illustrated in FIG. 4, a spring 117 is disposed between the arm 111 and the movable support 114.

Figure 6A:
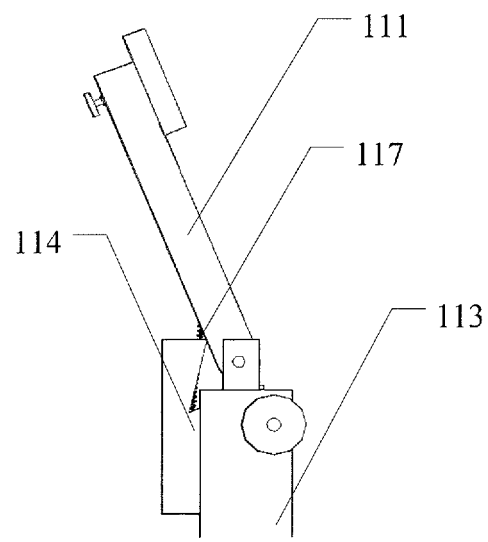
FIG. 6a is a schematic view of a working state of an arm of a light-on module testing device provided by an embodiment of the disclosure (the arm is raised)
Figure 6B:
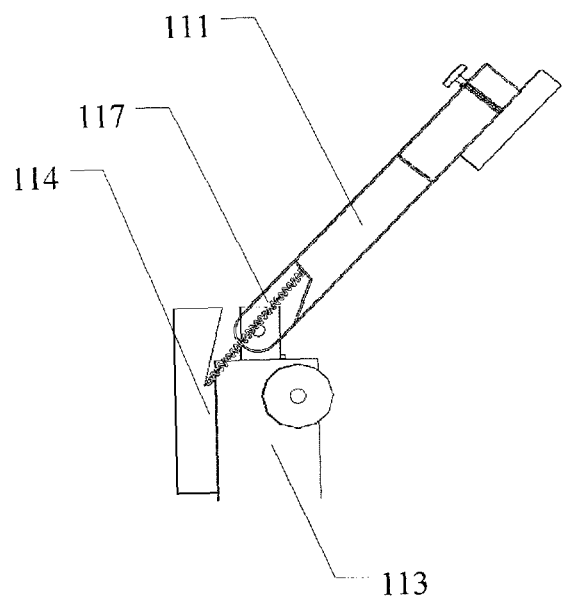
FIG. 6b is a schematic view of a working state of an arm of a light-on module testing device provided by an embodiment of the disclosure (the arm is in a critical state)
Figure 6C:
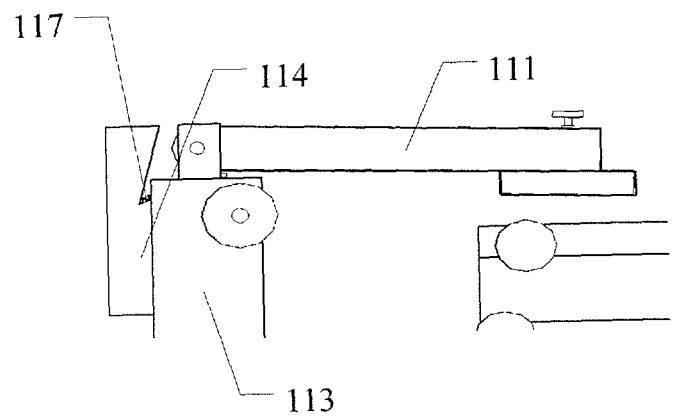
FIG. 6c is a schematic view of a working state of an arm of a light-on module testing device provided by an embodiment of the disclosure (the arm is dropped)

As illustrated in FIG. 6a, when the arm is in a raised state, by disposing the spring 117 between the arm 111 and the movable support 114, the changing of the state of the arm 111 needs to overcome the elastic force of the spring 117 to keep the arm 111 stable in the raised state, which is convenient to perform the operation such as changing the light-on module to be tested 112. As illustrated in FIG. 6b, when the arm 111 is in a critical state, the elastic force of the spring 117 reaches biggest, and the direction of the elastic force coincide with the extending direction of the arm 111, at this time, no elastic force of the spring 117 is needed to overcome to change the state of the arm 111. As illustrated in FIG. 6c, when the arm is in a dropped state, by disposing the spring 117 between the arm 111 and the movable support 114, the changing of the state of the arm 111 needs to overcome the elastic force of the spring 117 to keep the arm 111 stable in the dropped state, which is convenient to adjust the position and test the light-on module.

For example, according to the light-on module testing device provided by one example of the embodiment, as illustrated in FIG. 4, a via hole 1181 is disposed in the arm 111 on a side where is close to the light-on module to be tested 112, a connection hole 1182 is disposed on the light-on module to be tested 112, a screw fastener 119 is disposed in the via hole 1181 of the arm 111 to fix the light-on module to be tested 112. A screw thread can be disposed in the via hole 1181 to fix the light-on module to be tested well, the screw thread disposed in the via hole can match with a screw thread of the screw fastener 119.

For example, according to the light-on module testing device provided by one example of the embodiment, as illustrated in FIG. 4, a signal interface 1120 throughout the arm 111 is disposed in the arm 111, and an end of the signal interface 1120 is connected with a flexible printed circuit 2 (the flexible printed circuit can referring to FIG. 1) which is connected with the light-on module to be tested 112, the other end of the signal interface 1120 is a signal input end to input signal. For example, one end of the signal interface is located at inside of the anti, and the other end of the signal interface is located at outside of the arm. For example, the end outside of the arm is a signal input end. It is to be noted that, the signal interface 1120 can also not be provided. When the flexible printed circuit connected with the light-on module to be tested 112 is short, the signal interface 1120 can be provided.

Figure 7:
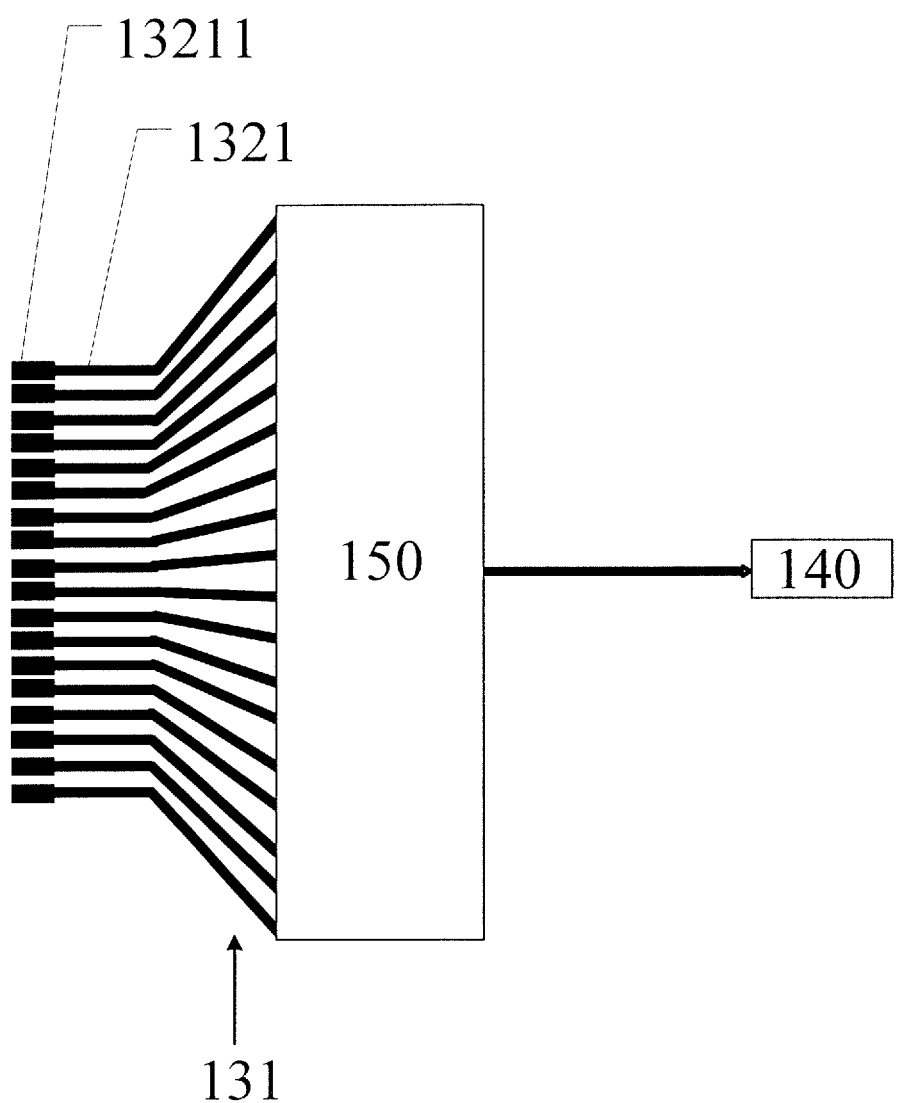
FIG. 7 is a schematic view of a light-on module testing device, in which test electrodes of a tester is connected to a conversion circuit and a computer, provided by an embodiment of the disclosure.
Figure 8:
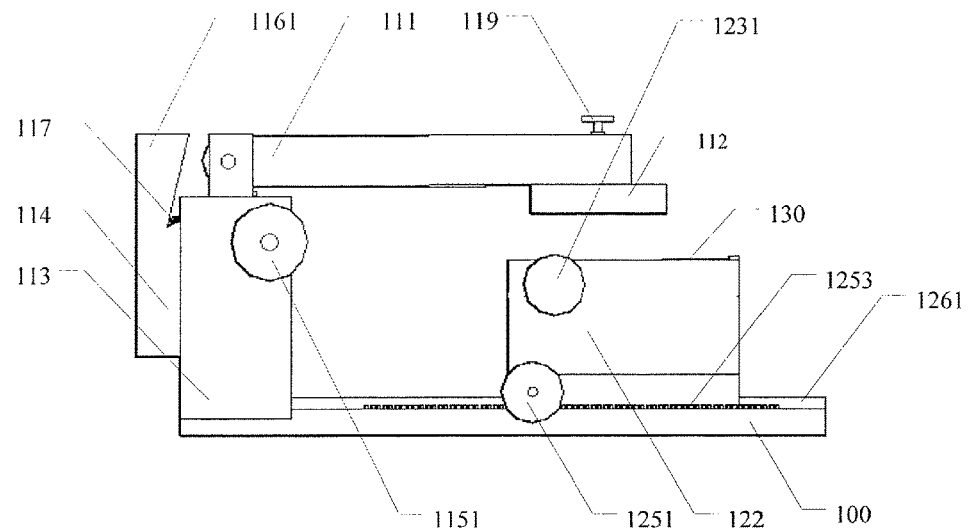
FIG. 8 is a front schematic view of a light-on module testing device provided by an embodiment of the disclosure.
Figure 9:
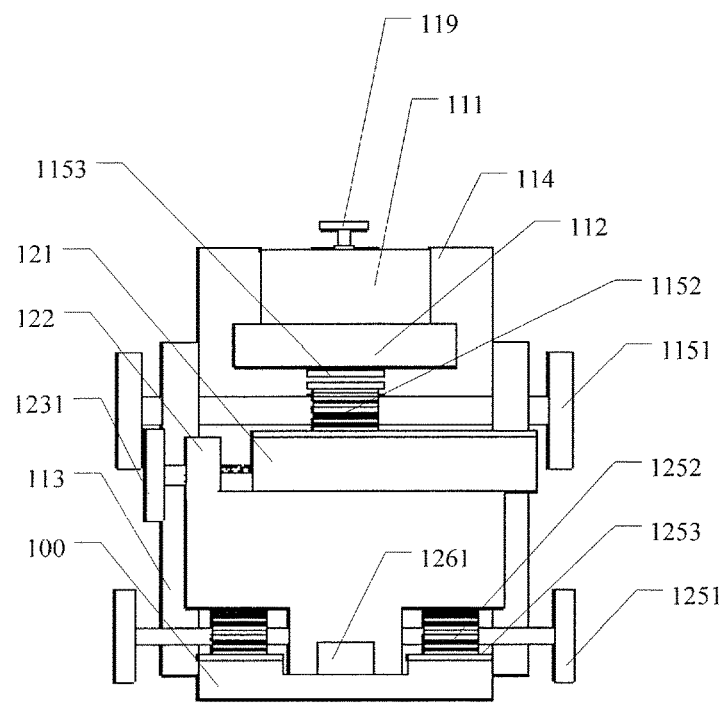
FIG. 9 is a right schematic view of a light-on module testing device provided by an embodiment of the disclosure.
Figure 10:
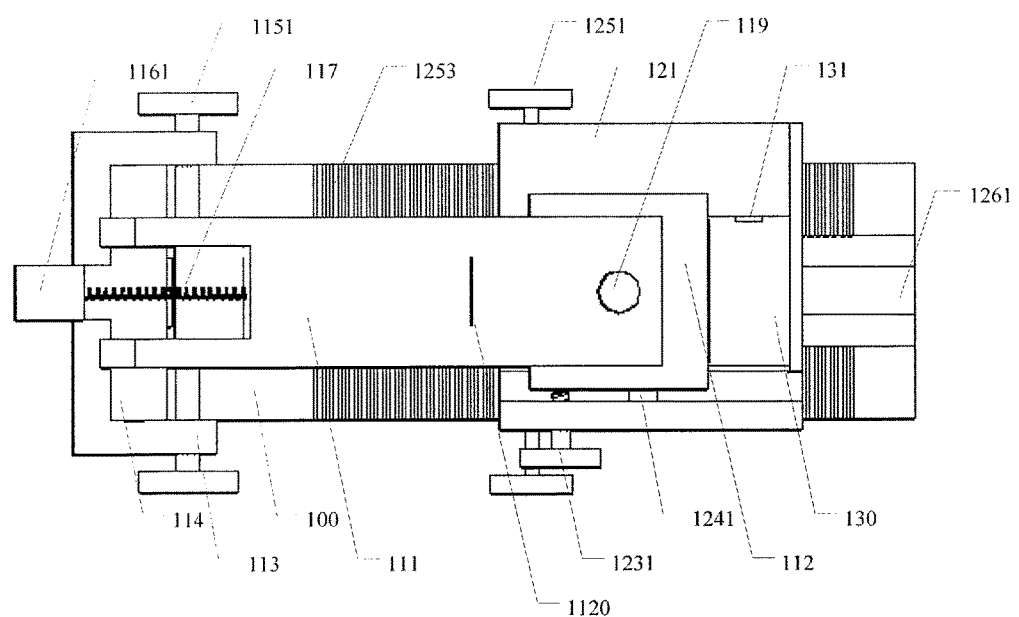
FIG. 10 is a top schematic view of a light-on module testing device provided by an embodiment of the disclosure.

For example, as illustrated in FIG. 7, according to the light-on module testing device provided by one example of the embodiment, further comprises a conversion circuit 150 connected with the signal output end 131 and a computer 140 connected with the conversion circuit 150. For example, test signal is converted to binary signal by the conversion circuit 150 and is output to the computer to display and analysis. For example, the conversion circuit can adopt a transistor-transistor-logic (TTL) circuit, and it is not limited thereto. As illustrated in FIG. 7, the test signal from the test electrodes 1321 of the electrode structure 132 on the tester 130 is input to the conversion circuit 150 by the signal output end, through code transformation by the conversion circuit 150, the test signal is input to the computer 140. Quantitative analysis to the output signals can be realized by analyzing those signals by the computer 140, and the position of abnormal probes can be determined accurately. If the light-on module to be tested 112 is normal, the property of the front end input circuit can be evaluated by the light-on module testing device provided by the example of the embodiment. For example, as illustrated in FIG. 7, a test electrode can have different width in different positions. For example, width (area) in the position where a test electrode contacts with a probe is larger than other positions. For example, a pad 13211 is disposed on the test electrode where the test electrode contacts with the probe. Width (area) of the pad 13211 is larger than that of other positions of the test electrode. Therefore, an area where the test electrode contacts the probe is larger, which is convenient to contact with the probe. Width for example means a length perpendicular to an extending direction of a test electrode, for example, means size of the test electrode. For example, structure of test probe can be similar with a pad area of a display panel.

It is to be noted that, the electrode structure provided by embodiments of the present disclosure includes number of the electrode, electrode spacing etc., the probe structure provided by embodiments of the present disclosure includes number of the probe, probe spacing etc.

The light-on module testing device provided by embodiments of the present disclosure has at least one beneficial effect as follows.

(1) An independent light-on module testing device is provided by disposing components such as the base 100, the support element 110, the arm 111, the test platform 120 and the tester 130, production apparatus is no need to be occupied, and test efficiency and production line apparatus activation are improved.

(2) Alignment of the light-on module to be tested 112 and the tester 130 is realized by disposing the first propulsion mechanism 123, the second propulsion mechanism 125 and the third propulsion mechanism 115. The probes and the test electrodes in a one-to-one relationship can be realized by disposing test electrodes (for example, the tester has the same electrode structure 61 with that of a pad area of a display panel corresponding to the light-on module to be tested 112) on the tester 130 corresponding to the probe structure of the light-on module to be tested 112.

(3) Quantitative analysis of light-on output can be realized by disposing the conversion circuit 150 and the computer 140, and the position of an abnormal probe can be determined rapidly and accurately.

Embodiment 2

A method for testing a light-on module by using a light-on module testing device is provided by the embodiment. The light-on module testing device comprises a base 100, a support element 110 disposed on the base 100, and a test platform 120 disposed on the base 100. An arm 111 is disposed on the support element 110, and the arm 111 is configured to fix a light-on module to be tested 112. A tester 130 is disposed on the test platform 120 and the tester 130 has a signal output end 131. And the method comprises following steps:

contacting the light-on module to be tested 112 with the tester 130;

inputting an electrical signal to the light-on module to be tested 112, and outputting an output signal by the signal output end 131 of the tester 130; and analyzing the output signal.

For example, according to the method for testing a light-on module by using a light-on module testing device provided by one example of the embodiment, the tester 130 comprises at least one test electrode 1321, the light-on module to be tested 112 comprises at least one probe 1121, the at least one test electrode 1321 of the tester 130 corresponds to the at least one probe 1121 of the light-on module to be tested 112 respectively, and the "correspond" means the same number, and of the same probe spacing and test electrode spacing etc. And the step of contacting the light-on module to be tested 112 with the tester 130 comprises: contacting the at least one probe 1121 of the light-on module to be tested 112 with the at least one test electrode 1321 of the tester 130 respectively. For example, probes 1121 and test electrodes 1321 correspond to each other in a one-to-one relationship.

For example, the tester 130 has the same electrode structure with that of a pad area of a display panel corresponding to the light-on module to be tested 112, and the pad area of the display panel comprises at least one electrode. Electrode structure 61 of a pad area of a display panel includes at least one electrode 6 (referring to FIG. 1). For example, electrodes 6 and probes 1121 correspond to each other in a one-to-one relationship.

For example, according to the method for testing a light-on module by using a light-on module testing device provided by one example of the embodiment, the at least one test electrode 1321 is connected with the signal output end 131 (for example, all test electrodes need to be connected with the signal output end 131. That is, test electrodes disposed are all connected with the signal output end) to transmit the electrical signal from the at least one probe 1121 to the signal output end 131 through the at least one test electrode.

For example, the method for testing a light-on module by using a light-on module testing device provided by the embodiment of present disclosure, any one of the light-on module testing device provided by embodiment 1 of present disclosure can be used.

According to the method for testing a light-on module by using a light-on module testing device provided by the embodiment, the position of the abnormal probe of the light-on module to be tested 112 can be tested independently, no production line apparatus is occupied with respect to a test using a production line apparatus, and test efficiency and production line apparatus activity are improved. In other aspect, according to the method for testing a light-on module by using a light-on module testing device provided by the embodiment, a position of an abnormal probe can be determined rapidly and accurately, quantitative analysis can be performed on the output signal, and test efficiency and accuracy can be further improved.

Embodiment 3

The embodiment provides a method for testing a display panel comprising:

testing a light-on module by any one of the method according to embodiment 2, and testing a display panel by the light-on module that have been tested.

According to the method provided by the embodiment, firstly a test is performed on the light-on module, the reliability of the light-on module is increased, and then misjudgment to defects of a display panel cannot be generated because of an abnormal light-on module in the process of a test to a display panel, and the efficiency is increased.

It is to be noted as following.

(1) The figures of the present disclosure only refer to the structure provided by the embodiments. Other structures can refer to usual designs based on the embodiments of the present disclosure.

(2) For clarity, components or area is scaled up and down in figures which are used to illustrate embodiments. That is, these figures are only schematic description and not described according to real proportion.

(3) New embodiments can be obtained by combining different embodiments or different features without conflict.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

This application claims the benefit of priority from Chinese patent application No. 201510580536.X, filed on Sep. 11, 2015, the disclosure of which is incorporated herein in its entirety by reference as a part of the present application.

What is claimed is:

1. A light-on module testing device comprising:
    a base;
    a support element disposed on the base, wherein an arm is disposed on the support element, and the arm is configured to fix a light-on module to be tested; and
    a test platform disposed on the base, wherein a tester is disposed on the test platform and the tester has a signal output end;
    wherein the test platform comprises an upper member and a lower member, the lower member is disposed on the base, the upper member is disposed on the lower member, the upper member is detachable, and the tester is disposed on the upper member.

2. The light-on module testing device according to claim 1, wherein the tester comprises at least one test electrode, the light-on module to be tested comprises at least one probe, the at least one test electrode corresponds to the at least one probe, and the at least one test electrode is connected with the signal output end.

3. The light-on module testing device according to claim 1, wherein the tester has a same electrode structure with that of a pad area of a display panel corresponding to the light-on module to be tested.

4. The light-on module testing device according to claim 1, wherein a first propulsion mechanism is disposed on the test platform, the first propulsion mechanism is configured to drive the upper member to move along a first direction with respect to the lower member.

5. The light-on module testing device according to claim 4, wherein the first propulsion mechanism comprises an X axis rotating rod, a screw thread disposed on the X axis rotating rod, and a screw thread hole disposed on the upper member, the X axis rotating rod is disposed on a side plate of the lower member, the screw thread disposed on the X axis rotating rod is engaged with the screw thread hole disposed on the upper member, the upper member is driven to move along an X axis direction by rotating the X axis rotating rod, and the X axis direction is the first direction.

6. The light-on module testing device according to claim 4, wherein a first groove and a first protrusion which are matched each other are disposed on the upper member and the lower member, respectively, the first groove and the first protrusion are disposed along the first direction.

7. The light-on module testing device according to claim 4, wherein a second propulsion mechanism is disposed on the test platform, the second propulsion mechanism is configured to drive the test platform to move along a second direction with respect to the base, the second direction is perpendicular to the first direction.

8. The light-on module testing device according to claim 7, wherein the second propulsion mechanism comprises a Y axis rotating rod, a gear disposed on the Y axis rotating rod, and a teeth bar disposed on the base, the Y axis rotating rod is mounted on a bottom of the test platform, the gear disposed on the Y axis rotating rod is engaged with the teeth bar disposed on the base, the test platform is driven to move along a Y axis direction by rotating the Y axis rotating rod, and the Y axis direction is the second direction.

9. The light-on module testing device according to claim 8, wherein a receiving slot is disposed on the bottom of the test platform, the Y axis rotating rod is disposed in the receiving slot.

10. The light-on module testing device according to claim 7, wherein the support element comprises a fixed support, a movable support, and a third propulsion mechanism, the arm is disposed on the movable support, the third propulsion mechanism is configured to drive the movable support to move along a third direction with respect to the fixed support, and the third direction is perpendicular to the first direction and the second direction.

11. The light-on module testing device according to claim 10, wherein the third propulsion mechanism comprises a Z axis rotating rod, a gear disposed on the Z axis rotating rod, and a teeth bar disposed on the movable support, the Z axis rotating rod is mounted on the fixed support, the gear disposed on the Z axis rotating rod is engaged with the teeth bar disposed on the movable support, the movable support is driven to move along a Z axis direction by rotating the Z axis rotating rod so that the light-on module to be tested is driven along the Z axis direction, and the Z axis direction is the third direction.

12. The light-on module testing device according to claim 10, wherein a spring is disposed between the arm and the movable support.

13. The light-on module testing device according to claim 1, wherein a signal interface throughout the arm is disposed in the arm, an end of the signal interface is connected with a flexible printed circuit which is connected with the light-on module to be tested, and the other end of the signal interface is a signal input end.

14. The light-on module testing device according to claim 1, further comprising a conversion circuit connected with the signal output end and a computer connected with the conversion circuit.

15. A light-on module testing device comprising:
   a base;
   a support element disposed on the base, wherein an arm is disposed on the support element, and the arm is configured to fix a light-on module to be tested; and
   a test platform disposed on the base, wherein a tester is disposed on the test platform and the tester has a signal output end;
   wherein a via hole is disposed in the arm, a connection hole is disposed on the light-on module to be tested, a screw fastener is disposed in the via hole to fix the light-on module to be tested.

16. A method for testing a light-on module by using a light-on module testing device, wherein the light-on module testing device comprises a base, a support element disposed on the base, and a test platform disposed on the base, an arm is disposed on the support element, and the arm is configured to fix a light-on module to be tested, a tester is disposed on the test platform and the tester has a signal output end; wherein the test platform comprises an upper member and a lower member, the lower member is disposed on the base, the upper member is disposed on the lower member, the upper member is detachable, and the tester is disposed on the upper member; and the method comprises following steps:
   contacting the light-on module to be tested with the tester;
   inputting an electrical signal to the light-on module to be tested, and outputting an output signal by the signal output end of the tester; and
   analyzing the output signal.

17. The method according to claim 16, wherein the tester comprises at least one test electrode, the light-on module to be tested comprises at least one probe, the at least one test electrode corresponds to the at least one probe, and the step of contacting the light-on module to be tested with the tester comprises: contacting the at least one probe of the light-on module to be tested with the at least one test electrode of the tester correspondingly.

18. The method according to claim 17, wherein the at least one test electrode is connected with the signal output end to transmit the electrical signal from the at least one probe to the signal output end through the at least one test electrode.

19. A method for testing a display panel comprising:
   testing a light-on module by the method according to claim 16, and
   testing a display panel by the light-on module.

* * * * *